United States Patent
Ando

(10) Patent No.: US 8,394,232 B1
(45) Date of Patent: Mar. 12, 2013

(54) PLASMA PROCESSING APPARATUS

(75) Inventor: Yasunori Ando, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 13/592,346

(22) Filed: Aug. 23, 2012

(30) Foreign Application Priority Data

Nov. 9, 2011 (JP) .................................. 2011-245408

(51) Int. Cl.
*C23C 16/00* (2006.01)
*H01L 21/306* (2006.01)
(52) U.S. Cl. ........... 156/345.48; 118/723 I; 118/723 AN
(58) Field of Classification Search ................ 118/723 I, 118/723 IR, 723 AN; 156/345.48, 345.49; 315/111.51
See application file for complete search history.

(56) References Cited

U.S. PATENT DOCUMENTS

2011/0115380 A1* 5/2011 Ebe et al. ................. 315/111.41

FOREIGN PATENT DOCUMENTS

| JP | H11-317299 | 11/1999 |
| JP | 2002-217119 | 8/2002 |
| JP | 2007-165410 | 6/2007 |
| WO | 0188221 | 11/2001 |
| WO | 2009142016 | 11/2009 |

\* cited by examiner

*Primary Examiner* — Luz L. Alejandro
(74) *Attorney, Agent, or Firm* — Jianq Chyun IP Office

(57) ABSTRACT

The plasma processing including an antenna which is substantially straight in a plan view of the antenna is provided. The antenna includes two rectangular conductor plates disposed on a same plane along a surface of a substrate in a manner that the two rectangular conductor plates are parallel to each other with an interval therebetween. An end of a side in a longitudinal direction of each of the two rectangular conductor plates is connected through a conductor so as to form a go-and-return conductor, wherein the high frequency current flows in the two rectangular conductor plates in opposite directions. Notches are formed at the sides of the two rectangular conductor plates adjacent to the interval and the notches facing each other define an opening. The notches form the openings. The openings are separately arranged in the longitudinal direction of the antenna.

8 Claims, 13 Drawing Sheets

PLASMA PROCESSING APPARATUS

CROSS-REFERENCE TO RELATED APPLICATION

This application claims the priority benefit of Japan application serial no. 2011-245408, filed on Nov. 9, 2011. The entirety of the above-mentioned patent application is hereby incorporated by reference herein and made a part of this specification.

BACKGROUND OF THE INVENTION

1. Field of the Application

The present invention relates to a plasma processing apparatus, and more particularly, to an inductively-coupled-plasma (ICP) type plasma processing apparatus.

2. Description of Related Art

Plasma processing apparatuses using high frequency (HF) to generate plasma can be classified into capacitively-coupled-plasma (CCP) type plasma processing apparatuses capable of generating capacitively-coupled plasma and inductively-coupled-plasma type (ICP) plasma processing apparatuses capable of generating inductively-coupled plasma.

It can simply say that a radiofrequency voltage is applied to two parallel electrodes and a high frequency electric field generated between the two electrodes is used to generate plasma in CCP type plasma processing apparatuses.

In the CCP type plasma processing apparatuses, there are problems causing the plasma potential to become higher due to a high voltage applied to the plasma. Since charged particles (e.g., ions) of the plasma impinge on the substrate with a high energy, the damage induced to the film which is formed on the substrate may increase and deteriorate the film quality.

On the other hand, in ICP type plasma processing apparatuses, an induction electric field generated by applying a radiofrequency current to flow to an antenna is used to generate plasma. Basically, compared with the CCP plasma processing apparatuses, the ICP plasma processing apparatuses have the advantage of being capable to lower the plasma potential.

Taking the ICP plasma processing apparatus as an example, in International Publication No. WO 2009/142016 (paragraphs [0024] to [0026], FIG. 1), a flat-board-like antenna is mounted on an opening of a vacuum container through an insulating frame. A high frequency power supply is supplied to the flat-board-like antenna so that a high frequency current can flow from one end to the other end of the antenna, and thereby plasma is generated due to the induced electric field. It has been described in WO 2009/142016 that the plasma is used to perform a plasma treatment to the substrate in the plasma processing apparatus.

SUMMARY OF THE INVENTION

In ICP type plasma processing apparatus, the antenna has to be long and the impedance (particularly inductance) of the antenna increases for a large substrate; thus, a large potential difference between the two terminals of the antenna would be induced.

Since the antenna potential is influenced by the plasma potential via the capacitance of the plasma, the antenna potential is increased with an increase of the plasma potential. As a result, challenges arise that the damage induced on the film which is formed on the substrate is increased and the film quality is decreased due to the charged particles (e.g., ions) of the plasma impinging on the substrate with a high energy.

In addition, in the case where large potential difference is generated between the two terminals in the longitudinal direction of the antenna, since the plasma generating action of CCP and the plasma generating action of original ICP may be superimposed in order to increase the amplitude of voltage of the antenna located around the higher voltage terminal, the plasma density located around the higher voltage terminal may become higher than the plasma density of other places. As a result, the uniformity of the plasma density distribution in the longitudinal direction of the antenna may deteriorate, and consequently the uniformity of the substrate treatment may get worse.

Accordingly, one exemplary embodiment of the present invention is to provide an (inductively-coupled plasma) ICP type plasma processing apparatus capable of decreasing the effective inductance of the antenna and suppressing the potential difference generated between the two ends of each side in the longitudinal direction of the antenna, and moreover capable of not only decreasing the plasma potential, but also increasing uniformity of the plasma density distribution in the longitudinal direction of the antenna.

The plasma processing apparatus of the present invention is an ICP type. The plasma processing apparatus includes an antenna, substantially straight in a plan view of the antenna, wherein a plasma is generated for performing a plasma treatment to a substrate by applying a high frequency current to the antenna to induce an electric field in a vacuum container. The antenna includes two rectangular conductor plates disposed on a same plane along a surface of the substrate in a manner that the two rectangular conductor plates are parallel to each other with an interval therebetween. An end of a side in a longitudinal direction of each of the two rectangular conductor plates is connected through a conductor so as to form a go-and-return conductor, wherein the high frequency current flows in the two rectangular conductor plates in opposite directions. Herein a plurality of notches are formed at the sides of the two rectangular conductor plates adjacent to the interval, and the notches of the plurality of notches facing each other define an opening. The plurality of notches forms the plurality of openings, and the plurality of openings are separately arranged in the longitudinal direction of the antenna.

Referring to the perspective view of the antenna of the plasma processing apparatus, since a high frequency current can flow in opposite directions between the two rectangular conductor plates which act as the go-and-return conductor structure, the effective inductance of the antenna is decreased due to the mutual inductance existing between the go-and-return conductors. Accordingly, the potential difference generated between the two ends of each side in the longitudinal direction of the antenna can be decreased, thus not only the plasma potential can be decreased, but also the uniformity of the plasma density distribution in the longitudinal direction of the antenna can be improved.

Additionally, in general, referring to the high frequency current which flows through the antenna, the high frequency current has a tendency to flow to the ends of the two rectangular conductor plates by the skin effect. When the high frequency current reaches the sides of the two rectangular conductor plates adjacent to the interval and since the high frequency current can flow in opposite directions between the adjacent sides adjacent to the interval, compared to the sides facing away from the interval, the inductance (also impedance, hereinafter the same) is smaller. Accordingly, more high frequency current may flow along the sides adjacent to the interval and the openings which are formed thereon. As a result, since the openings are separately arranged in the longitudinal direction of the antenna and having the function similar to coil and simple structure, the openings can be formed like a plurality of coils connected in series. Accordingly in such simple structure, a strong magnetic field may be generated around each of the openings and success rate of plasma generating can be increased.

Moreover, since the high frequency current can flow in opposite directions at the sides adjacent to the interval and the inductance of the connecting portions between the openings are decreased, compared to the conventional (namely one way) connecting conductors in which merely a plurality of coils are connected in series, the inductance of the antenna can be decreased and the potential difference generated between the two ends of the antenna in the longitudinal direction can also be decreased. The effect is as described above.

The openings of the plurality of openings located at the two ends of the antenna in the longitudinal direction can be formed larger than the rest of the plurality of openings. The distance between each of the plurality of openings located at two ends of the antenna in the longitudinal direction is smaller than a distance between the rest of two openings of the plurality of openings. Combination of both can also be used.

Instead of disposing the two rectangular conductor plates on the same plane along the surface of the substrate, the two rectangular conductor plates are configured in a V-shape cross-sectional structure, wherein the V-shape cross-sectional structure is separated relatively wide at a side facing away from the surface of the substrate and the two sides of the two rectangular plates adjacent to the interval are closely disposed in parallel to each other with the interval therebetween. The two rectangular conductor plates are configured in a manner that the two rectangular conductor plates are bent in a short side direction to form a U-shape cross-sectional structure, wherein the U-shape cross-sectional structure is separated relatively wide at a side facing away from the surface of the substrate and the two sides of the two rectangular plates adjacent to the interval are closely disposed in parallel to each other with the interval therebetween.

A periphery of a side facing away from the interval of each of the two rectangular conductor plates is covered by a conductor, wherein a specific resistance of the conductor is greater than a specific resistance of a material of the two rectangular conductor plates, and a thickness of the conductor is equal to or greater than a skin depth of the high frequency current flowing through the conductor.

According to claim 1 of the present invention, since a high frequency current can flow in opposite directions between the two rectangular conductor plates which act as the go-and-return conductor structure, the effective inductance of the antenna is decreased due to the mutual inductance existing between the go-and-return conductors. Accordingly, the potential difference generated between the two ends of the antenna in the longitudinal direction can be decreased, thus not only the plasma potential can be decreased, but also the uniformity of the plasma density distribution in the longitudinal direction of the antenna can be improved.

Due to the plasma potential being able to be suppressed, since the energy of the charged particles of the plasma impinging on the substrate can be reduced, for example, the damage induced to the film which is formed on the substrate is decreased and improving the film quality becomes possible. Moreover, in the case of the antenna is long, as the reasons mentioned above, since the potential of the plasma and the antenna can be reduced, it is easier to design a larger substrate corresponding to the longer antenna.

Since the uniformity of the plasma distribution along the longitudinal direction of the antenna can be increased, the uniformity of the substrate treatment in the longitudinal direction of the antenna can also be increased. For example, the uniformity of the film thickness in the longitudinal direction of the antenna can be improved.

Furthermore, if the high frequency current flowing through the antenna is thoroughly viewed, the high frequency current has a tendency to flow to the ends of the two rectangular conductor plates by the skin effect. When the high frequency current reaches the sides of the two rectangular conductor plates adjacent to the interval and since the high frequency current can flow in opposite directions between the adjacent sides, compared to the interval and the sides facing away from the interval, the inductance or impedance is smaller. Accordingly, more high frequency current may flow along the sides adjacent to the interval and the openings which are formed thereon. As a result, since the openings are separately arranged in the longitudinal direction of the antenna and having the function similar to coil and simple structure, the openings can be formed like a plurality of coils connected in series. Accordingly in such simple structure, a strong magnetic field may be generated around each of the openings and success rate of plasma generating can be increased.

Moreover, since the high frequency current can flow in opposite directions at the adjacent sides and the inductance of the connecting portions between the openings are decreased, compared to the conventional (namely one way) connecting conductors in which merely a plurality of coils are connected in series, the inductance of the antenna can be decreased and the potential difference generated between the two ends of the antenna in the longitudinal direction can also be decreased. The effect is as described above.

According to claim 2 of the present invention, the invention further has another effect. Namely, in general, as for the plasma density distribution in the longitudinal direction of the antenna, the plasma density distribution at the two ends may tend to be smaller than other places. On the other hand, in the embodiment of the present invention, since the magnetic flux density around the openings located at the two ends of the antenna can be larger and the plasma density can be increased by designing the openings located at the two ends of the antenna in the longitudinal direction to be larger than the rest of the openings, the uniformity of the plasma density distribution along the longitudinal direction of the antenna can be enhanced. As a result, the uniformity of the substrate treatment in the longitudinal direction of the antenna can be improved. For example, the uniformity of the film thickness along the longitudinal direction of the antenna can also be increased.

According to claim 3 of the present invention, the invention further has another effect. Namely, in general, as for the plasma density distribution in the longitudinal direction of the antenna, the plasma density distribution at the two ends may tend to be smaller than other places. On the other hand, in the embodiment of the present invention, since the magnetic flux density around the openings located at the two ends can be larger and the plasma density can be increased by designing the distance between each of the openings located at the two ends of the antenna in the longitudinal direction to be smaller than the distance between the rest of openings, the uniformity of the plasma density distribution along the longitudinal direction of the antenna can be enhanced. As a result, the uniformity of the substrate treatment in the longitudinal direction of the antenna can be improved. For example, the uniformity of the film thickness along the longitudinal direction of the antenna can also be increased.

According to claim 4 of the present invention, the invention further has another effect. Namely, the high frequency current and the induced current which flow in an opposite direction flow through the two rectangular conductor plates in the plasma, thus the impedance of the antenna can be decreased. However, since the two rectangular conductor plates are configured in a V-shape cross-sectional structure, wherein the V-shape cross-sectional structure is separated relatively wide at a side facing away from the surface of the substrate and the two sides of the two rectangular plates adjacent to the interval are closely disposed in parallel to each other with the interval therebetween, the decreasing of the inductance is fewer and the impedance is increased. As a result, since more high frequency current can flow along the sides adjacent to the interval and the openings formed on the sides adjacent to the interval of the two rectangular conductor plates, the high frequency power can be effectively supplied for plasma generating. Accordingly, both the plasma generating efficiency and the high frequency power utilization efficiency can be increased.

According to claim 5 of the present invention, the invention further has another effect. Namely, since each of the two rectangular conductor plates configured in a manner that the two rectangular conductor plates are bent in a short side direction to form a U-shape cross-sectional structure, wherein the U-shape cross-sectional structure is separated relatively wide at a side facing away from the surface of the substrate and the two sides of the two rectangular plates adjacent to the interval are closely disposed in parallel to each other with the interval therebetween, for the same reason as described above according to claim 4, the decrease of the inductance is fewer and the impedance is increased. As a result, since more high frequency current can flow along the sides adjacent to the interval and the openings formed on the sides adjacent to the interval of the two rectangular conductor plates, the high frequency power can be effectively supplied for plasma generating. Accordingly, both the plasma generating efficiency and the high frequency power utilization efficiency can be increased.

According to claim 6 of the present invention, the invention further has another effect. Namely, a periphery of a side facing away from the interval of each of the two rectangular conductor plates is covered by a conductor, wherein a specific resistance of the conductor is greater than a specific resistance of a material of the two rectangular conductor plates and a thickness of the conductor is equal or greater than a skin depth of the high frequency current flowing through the conductor. Thus, by the skin effect, the high frequency current can mainly flow through the conductor with higher specific resistance. Therefore, the impedance of the sides adjacent to the interval and the sides facing away from the interval of the two rectangular conductor plates is increased. As a result, since more high frequency current can flow along the sides adjacent to the interval and the openings formed on the sides adjacent to the interval of the two rectangular conductor plates, the high frequency power can be effectively supplied for plasma generating. Accordingly, both the plasma generating efficiency and the high frequency power utilization efficiency can be increased.

According to claim 7 of the present invention, the invention further has another effect. Namely, since the dielectric plate is disposed between the antenna located in the vacuum container and a generating region of the plasma so as to obstruct the antenna from the plasma, the surface of the antenna can be prevented from being sputtered by the charged particles (mainly ions) in the plasma. Thus, it is possible to prevent the possibility of causing metal contamination to the plasma and the substrate because of the sputtering. Moreover, although electrons which form the plasma are lighter and the mobility thereof is much larger than the ions, the escaping of the electrons impinged to the antenna can be avoided due to the dielectric plate. The increase of the plasma potential can be suppressed.

Furthermore, since the antenna located in the vacuum container is buried in the dielectric material, the unnecessary plasma close to the antenna located in the vacuum container is prevented to be generated. Accordingly, inconvenience due to the increase of instability of the plasma required for substrate treatment and decreasing of utilization efficiency of the high frequency power can be prevented.

According to claim 8 of the present invention, the invention further has another effect. Namely, the plasma processing apparatus includes a plurality of antennas disposed in parallel to each other, wherein a high frequency power is parallelly supplied to each of the antennas by using a common high frequency power source, so that a larger area of plasma can be generated. In addition, since the high frequency current is parallelly supplied by the common high frequency power source in a manner that the high frequency current flowing through the adjacent antennas at the adjacent rectangular conductor plates at two sides facing away from the interval can be in the same direction, and due to the mutual inductance existing between the sides adjacent to the interval and the sides facing away from the interval, the inductance at the sides is increased. As a result, since the high frequency current flowing through the adjacent antennas at the adjacent rectangular conductor plates at two sides facing away from the interval can be decreased and the high frequency current flowing through the sides adjacent to the interval and the openings can be increased, the magnetic field generated around the openings can be increased. Accordingly, since the high frequency power can be effectively supplied for plasma generating, both the plasma generating efficiency and the high frequency power utilization efficiency can be increased.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
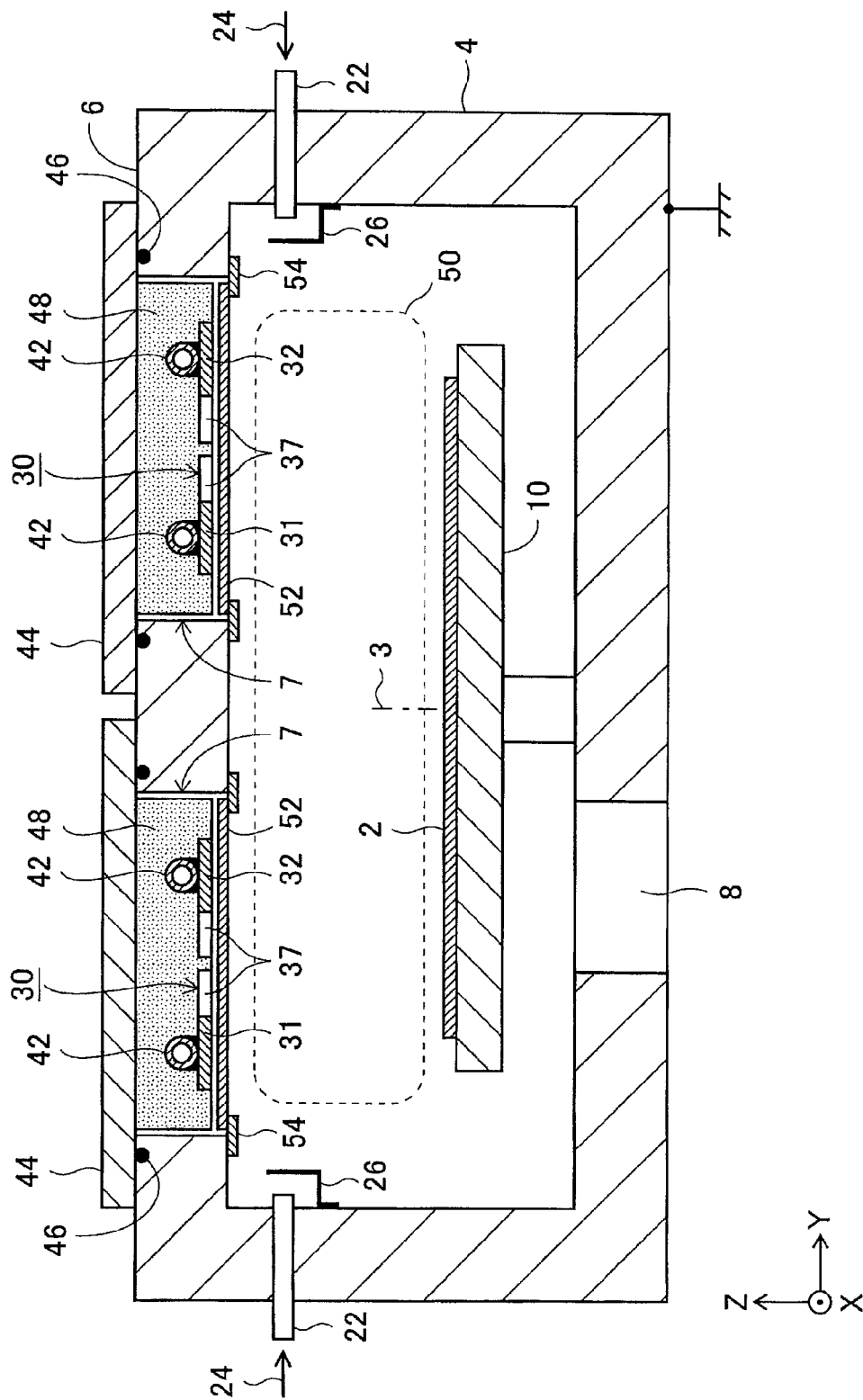
FIG. 1 is a cross-sectional view of a plasma processing apparatus according to an exemplary embodiment of the present invention.

A plasma processing apparatus according to an exemplary embodiment of the present invention is shown in FIG. 1, and FIG. 2 to FIG. 4 show the antenna 30 of FIG. 1. Except FIG. 1 and FIG. 2, in order to simplify the figures, the cooling pipe is omitted in the figures. The cooling pipe is also omitted in the figures of exemplary embodiments described later.

In order to describe the directions of the antenna 30, the X direction, Y direction and Z direction, as shown in the figure, are orthogonal to each other. The Z direction is the direction of the perpendicular line 3 standing on a surface of the substrate 2. The Y direction is the direction orthogonal to the perpendicular line 3. These directions are respectively known as the up-down direction Z and the left-right direction Y to simplify the descriptions. The X direction is the direction orthogonal to the perpendicular line 3 and is the longitudinal direction of the antenna 30. For example, the X direction and Y direction are horizontal, but it is not limited thereto. The foregoing descriptions of the X direction, Y direction and Z direction are applicable in other figures.

The apparatus is an inductively-coupled plasma (ICP) type plasma processing apparatus. A high frequency current $I_R$ from a high frequency power source 60 is applied to an antenna 30, that is substantially straight in a plan view of the antenna, in the apparatus so that an electric field is induced in a vacuum container 4 to generate a plasma 50, and the plasma 50 is used to perform a plasma treatment to a substrate 2.

The term "substantially straight" not only represents "a straight status" according to the plan meaning of the words, but also represents "a nearly straight status".

In order to holder the substrate 2, a holder 10 is disposed in the vacuum container 4.

The substrate 2 can be substrates used in flat panel displays (FPD) such as liquid crystal displays and organic electroluminescent displays, flexible substrates used in flexible displays, substrates used in solar cells of semiconductor display or the like; the present invention is not limited thereto.

The planar shape of the substrate 2 can be circular or quadrilateral, but the planar shape is not restricted in the present invention.

The treatment process to the substrate 2, for example, is forming a film by means of plasma CVD (chemical vapour deposition) process, etching, ashing, sputtering and the like.

The plasma processing apparatus is respectively called, a plasma CVD apparatus if it is used for the plasma CVD process, a plasma etching apparatus for etching process, a plasma ashing apparatus for ashing process, and a plasma sputtering apparatus for sputtering process.

The plasma processing apparatus has a vacuum container 4 made of metal and the interior of the vacuum container 4 is vacuumed by using a vacuum exhaust device 8.

A gas 24 is brought into the vacuum container 4 through an inlet pipe 22. In the embodiment, a plurality of inlet pipes 22 are disposed along the longitudinal direction X of the antenna 30, and a diffusion plate 26 can be disposed in front of the inlet pipes 22 so as to diffuse the gas 24.

The gas 24 may be any gas which is appropriate to the processing content of the substrate 2. For example, if the substrate 2 is to form a film thereon by using the plasma CVD process, the gas 24 is a source gas and a diluted source gas (e.g., $H_2$). More specifically, the source gas 24 is $SiH_4$ for a Si film, $SiH_4+NH_3$ for a SiN film, $SiH_4+O_2$ for a $SiO_2$ film formed on the substrate 2, respectively.

A planar-shaped opening 7 is disposed at the ceiling 6 of the vacuum container 4, wherein the opening 7 corresponds to the planar shape of the antenna 30. In the embodiment, two openings 7 are disposed and an antenna 30 is disposed in each of the openings 7. In other words, there are two antennas 30 in the present embodiment.

A cover plate (e.g., flange) 44 is disposed on each of the openings 7, wherein a packing 46 used for vacuum sealing is disposed between each of the cover plates 44 and ceilings 6. Each of the cover plates 44 can be made of dielectric material, but in the present embodiment, each of the cover plates 44 is made of metal and electrically grounded together with the vacuum container 4. Thus, the high frequency leakage of the antenna 30 to the outside can be prevented.

Figure 3:
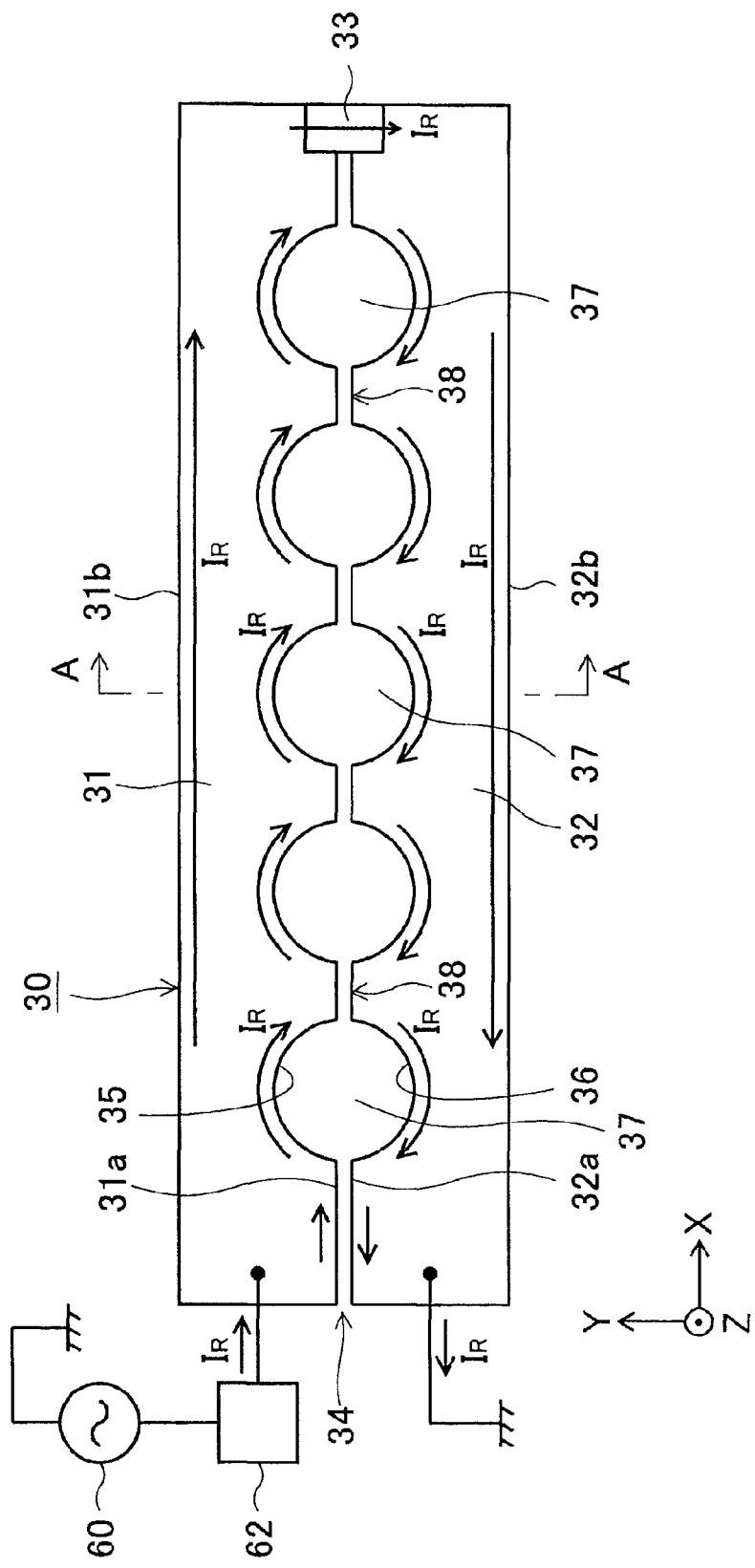
FIG. 3 is a plan view of the antenna of FIG. 1, wherein the cooling pipe is omitted.

Mainly referring to FIG. 3, in each of the antennas 30, two long rectangular conductor plates 31, 32 are disposed on the same plane (namely in the embodiment, the same plane parallel to the XY plane) along the surface of the substrate 2 in the X direction, wherein the two rectangular conductor plates 31, 32 are closely and parallelly disposed to each other with an interval 34 therebetween. In other words, a side of one of the two rectangular conductor plates 31, 32 is opposite to a side of the other with an interval 34 therebetween and the two rectangular conductor plates 31, 32 are close and parallel to each other. In addition, an end of a side in the longitudinal direction X of one of the two rectangular conductor plates 31 and an end of a side in the longitudinal direction X of the other rectangular conductor plate 32 are connected through a conductor 33. In the embodiment, the conductor 33 can be integrally or separately formed with the two rectangular conductor plates 31, 32.

The material of the conductor 33 and each of the two rectangular conductor plates 31, 32 is, for example, copper (more particularly oxygen-free copper OFC), aluminum and the like, but it is not restricted thereto.

A high frequency power is supplied to the two rectangular conductor plates 31, 32 which form the antenna 30 by a high frequency power source 60 through a matching circuit 62 so that a high frequency current $I_R$ (go-and-return current) flows in opposite directions in the two rectangular conductor plates 31, 32 (since it is a high frequency, the direction of the high frequency current $I_R$ reverses according to the time, and it is similar in the following). Specifically, an end, opposite to the conductor 33, of a side of the rectangular conductor plate 31 is referred as a power feeding point, while an end, opposite to the conductor 33, of a side of the other rectangular conductor plate 32 is referred as an endpoint. As shown in the figure, the endpoint can be directly connected to the ground, and connected to the ground via a condenser, and it is similar in the antennas 30 of other embodiments.

Figure 4:
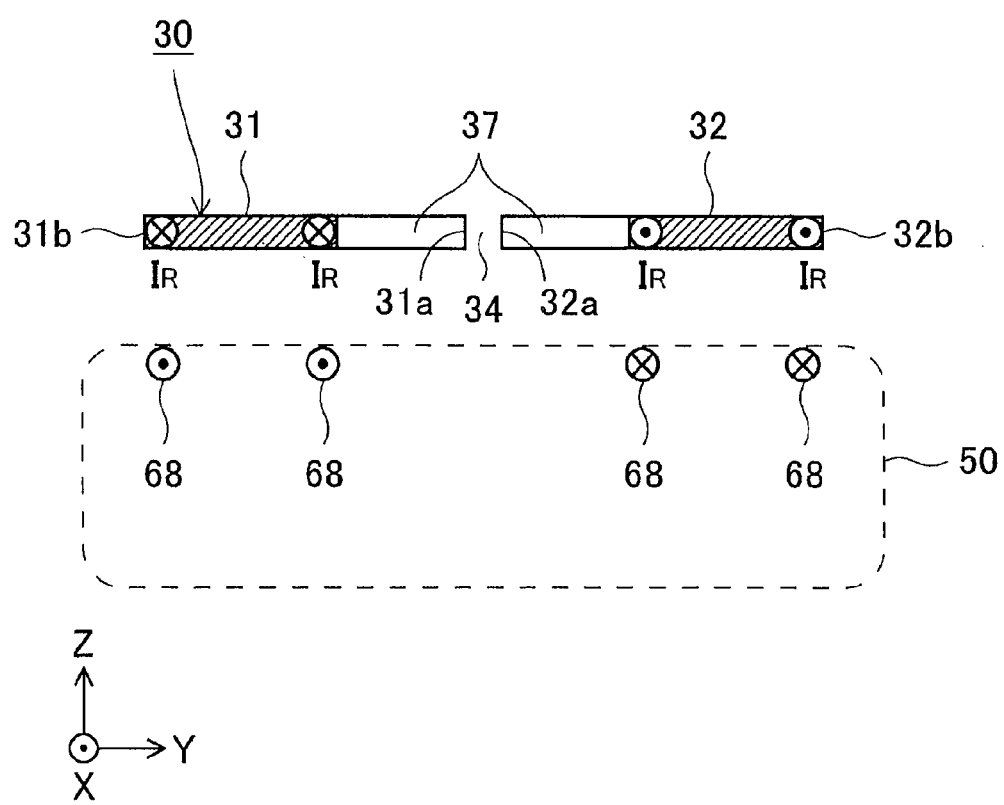
FIG. 4 is an enlarged cross-sectional view along Line A-A of FIG. 3.

In addition, for the sake of simplifying the descriptions, only one high frequency power source 60, matching circuit 62 and antenna 30 are illustrated in FIG. 3 and FIG. 4, but the high frequency power source 60 and the matching circuit 62 can be commonly used to a plurality of antennas 30. Namely, a common high frequency power source 60 can be parallelly supplied high frequency power to a plurality of antennas 30 which are disposed in parallel to each other. The exemplary embodiments thereof are described later.

A high frequency magnetic field is generated due to the high frequency current $I_R$, and a high frequency current $I_R$ and an electric field to the opposite direction are induced due to the high frequency magnetic field. Due to the electric field, within the vacuum container 4, electrons are accelerated, the gas 24 near the antenna 30 is ionized and plasma 50 is formed near the antenna 30. The plasma 50 is diffused into the surrounding of the substrate 2, and the substrate 2 is treated by using the plasma 50.

The frequency of the high frequency power output from the high frequency power source 60 is 13.56 MHz in general, but the present invention is not limited thereto.

The interval 34 is formed between the sides 31*a*, 32*a*, located beside the interval 34, of the two rectangular conductor plates 31, 32 (in other words, the sides adjacent to the interval 31*a*, 32*a*). A plurality of notches 35, 36 are respectively disposed on the sides adjacent to the interval 31*a*, 32*a* and the interval 34 is sandwiched between the notches 35, 36. A space formed by a notch 35, a notch 36 and the interval 34 sandwiched therebetween is defined as an opening 37. The openings 37 are formed along the longitudinal direction X of the antenna 30. The quantity of the openings 37 can be five, but it is not limited thereto. It is similar in the antennas 30 of other embodiments.

Each of the notches 35, 36 can be symmetrically formed by taking the interval 34 as center portion. The shape of each of the openings 37 is circular as shown in the figure, but it can also be square, rectangular or the like.

Referring to perspective view of the antenna 30, the two rectangular conductor plates act like the go-and-return conductor structure and the high frequency current $I_R$ flows in opposite directions therein, the effective inductance of the antenna 30 is decreased due to the mutual inductance existing between the go-and-return conductors (the two rectangular conductor plates) 31, 32.

In detailed, the total impedance $Z_T$ of two go-and-return conductors which are closely disposed in parallel, described in books, such as theory of electricity as a differential connection, can be represented by the following equation. Herein, for the sake of simplification of description, R represents resistance of each conductor, L represents self-inductance of each conductor, and M represents mutual inductance of the two conductors.

$$Z_T=2R+j2(L-M) \qquad (1)$$

The inductance $L_T$ in the total impedance $Z_T$ is described in the following equation. Regarding the inductance $L_T$, the combination of the self inductance and the mutual inductance is defined as an effective inductance in this specification.

$$L_T=2(L-M) \qquad (2)$$

It can be noted from the above equations that both the effective inductance $L_T$ of the two go-and-return conductors is decreased due to the mutual inductance M, and thus the total impedance $Z_T$ is also decreased. This principle can also be applied to the antenna 30 having the go-and-return conductor structure.

According to the principle, compared the decrease of the effective inductance of the antenna 30 to the conventional flat-plate shape antenna, the potential difference generated between the two ends of the antenna 30 in the longitudinal direction X can be decreased. Thus, along with the decrease of the potential of the plasma 50, the uniformity of the plasma density distribution along the longitudinal direction X of the antenna 30 can also be improved.

Since the potential of the plasma 50 can be decreased, the energy of the charged particles (e.g., ions) impinged to the surface of the substrate 2 from the plasma 50 can be decreased. Thus, for example, in the case of forming film on the substrate 2 by the plasma 50, the damage caused to the film can be decreased and the film quality can be enhanced. In addition, in the case of the antenna 30 having a longer length in the longitudinal direction X, according to the aforementioned, since the potential of the antenna 30 can be decreased and the plasma potential can be decreased, it is easier to design a larger substrate 2 corresponding to the longer antenna 30.

Since the uniformity of the plasma density distribution along the longitudinal direction X of the antenna 30 can be increased, the uniformity of the substrate treatment along the longitudinal direction X of the antenna 30 can also be enhanced. For example, in the case of forming a film on the substrate 2 by the plasma 50, the uniformity of the thickness distribution of the film along the longitudinal direction X of the antenna 30 can be improved.

Additionally, referring to the high frequency current $I_R$ flowing through the antenna 30 in detailed, as shown in FIG. 3 and FIG. 4, the high frequency current $I_R$ mainly intends to flow to the ends of each side of the two rectangular conductor plates 31, 32 because of the skin effect. Herein, referring to the sides located near the interval 34 (the sides adjacent to the interval) 31*a*, 32*a* of the two rectangular conductor plates 31, 32, since the high frequency current $I_R$ can flow in opposite directions between the sides which are closely located, compared to the sides opposite to the interval 34 (defined as the sides facing away from the interval) 31*b*, 32*b*, both the inductance and the impedance become smaller.

Namely, referring to the high frequency current $I_R$ flowing through the antenna 30, for the high frequency current $I_R$ flowing through the sides facing away from the interval 31*b*, 32*b*, the high frequency current does not flow in opposite directions, while the high frequency current $I_R$ flows in opposite directions when it flows in the sides adjacent to the interval 31*a*, 32*a*. Therefore, both the inductance and the impedance of the sides adjacent to the interval 31*a*, 32*a* can be smaller. This is in accordance with the principle previously described in Equation 1 and Equation 2. That is, the effective inductance of the sides adjacent to the interval 31*a*, 32*a* is decreased due to the mutual inductance.

As described earlier, referring to the perspective view of the antenna 30, it can be specifically seen that, it is possible to say that the decrease of the effective inductance due to the existence of the mutual inductance is significantly contributed by the decrease of inductance due to the mutual inductance between the sides adjacent to the interval 31a, 32a.

Figure 5:
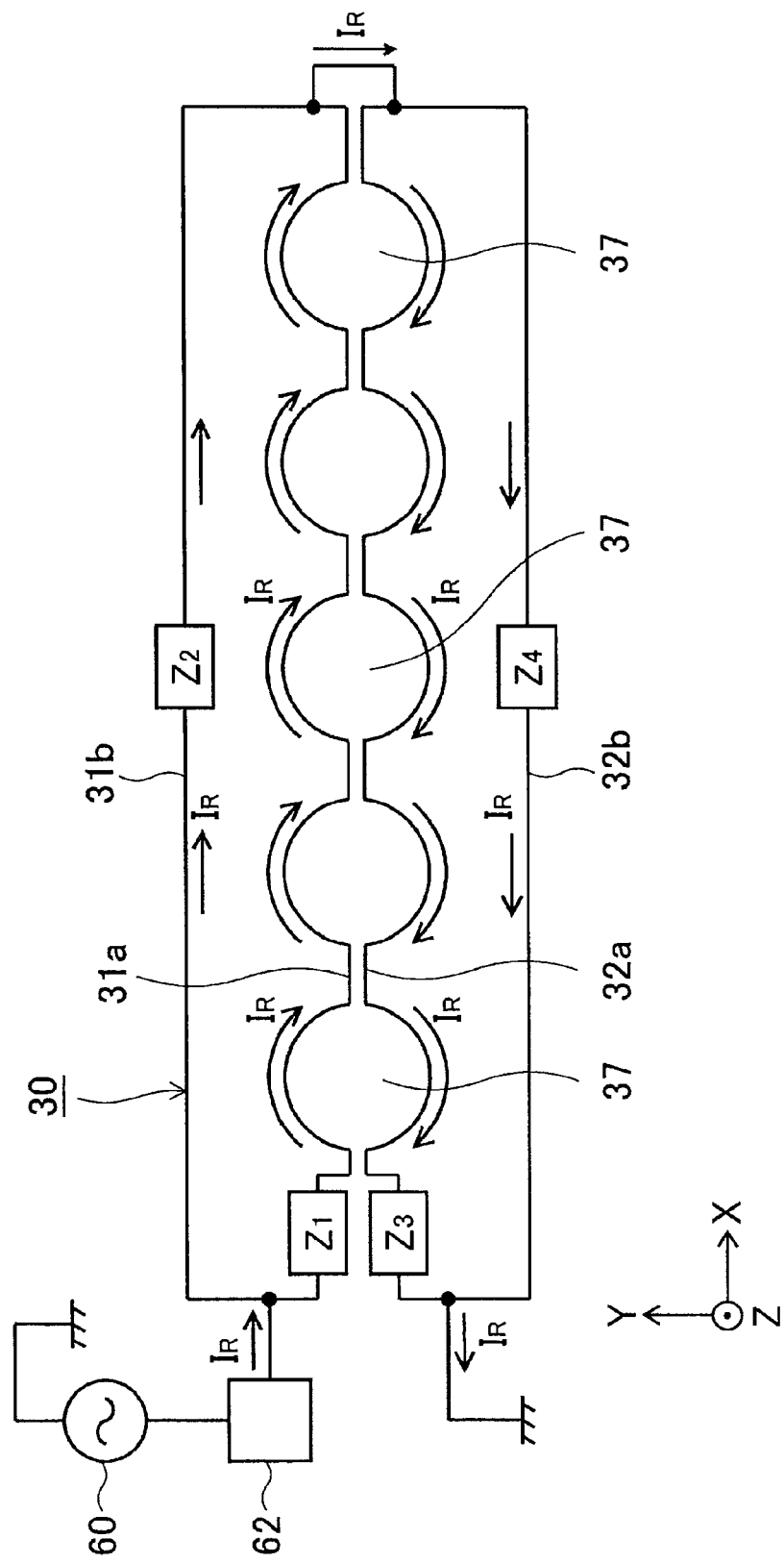
FIG. 5 is an equivalent circuit diagram of the antenna of FIG. 3.

Referring to the high frequency current $I_R$ flowing through the sides adjacent to the interval 31a, 32a and the sides facing away from the interval 31b, 32b of the antenna 30, the matching circuit of the antenna 30 shown in FIG. 3 is illustrated in FIG. 5. Actually, in the embodiment, the impedances separately distributed on the sides adjacent to the interval 31a, 32a and sides facing away from the interval 31b, 32b are respectively represented by $Z_1$, $Z_3$, $Z_2$ and $Z_4$. Accordingly, the impedances $Z_1$, $Z_3$ of the sides adjacent to the interval 31a, 32a are smaller than the impedances $Z_2$, $Z_4$ of the sides facing away from the interval 31b, 32b.

Accordingly, the high frequency current $I_R$ can flow more along the sides adjacent to the interval 31a, 32a and the openings 37 formed thereon. As a result, since the openings 37 are separately arranged in the longitudinal direction X of the antenna 30 and having the function similar to coil and simple structure, the openings 37 can be formed like a plurality of coils connected in series. Accordingly in such simple structure, a strong magnetic field may be generated around each of the openings 37 and success rate of plasma generating can be increased.

Figure 6:
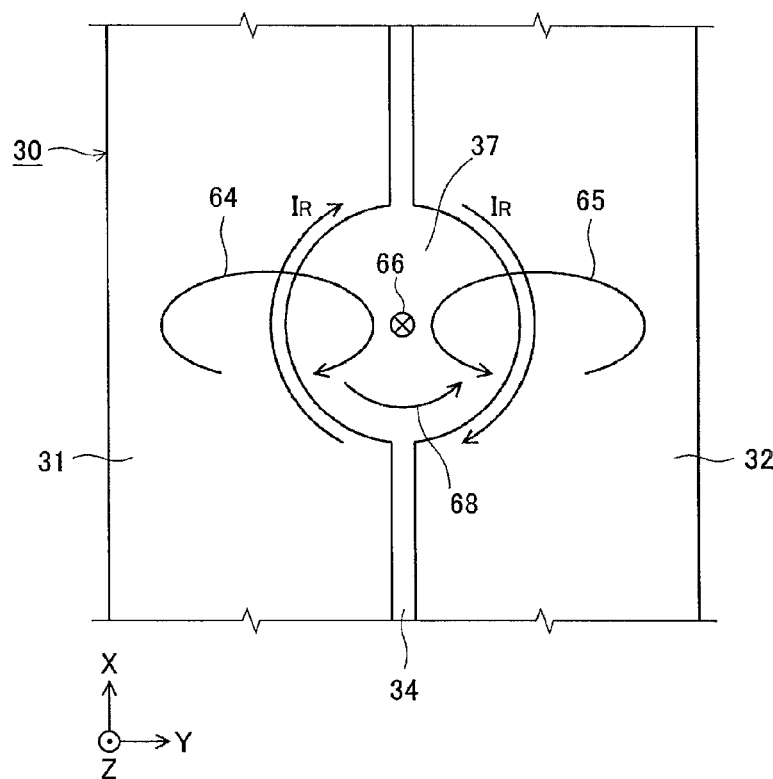
FIG. 6 is an enlarged plan view of the opening of the antenna of FIG. 3.

The forming of magnetic field around each of the openings 37 is described with the reference of FIG. 6. Since the high frequency current $I_R$ flows in opposite directions along the opening 37 (the cutouts) and the magnetic fields 64, 65 respectively generated thereon are in the same direction in the opening 37, the magnetic field intensity becomes the sum of that of the two magnetic fields 64, 65, and thus a strong magnetic field can be generated. In addition, the intensity of the magnetic field 66 which is perpendicular (i.e., direction Z) to the antenna surface (the conductor surface) can be increased. The inductive current 68 flowing in the plasma 50 and induced by the magnetic field can make the high frequency current $I_R$ flow in the opposite directions by orbiting the magnetic field 66.

Moreover, referring to FIG. 3, in the connecting portion 38 between each of the openings 37, since the high frequency current $I_R$ flows in opposite directions between the edges being close to each other, the inductance becomes smaller as described earlier. Compared to the conventional (namely one way) connecting conductors in which merely a plurality of coils are connected in series, the inductance of the antenna 30 can be decreased and the potential difference generated between the two ends of the antenna 30 in the longitudinal direction X can also be decreased. The effect is as described above.

Furthermore, regarding the high frequency current $I_R$ flowing in the antenna 30 and the inductive current 68 in the plasma 50 which is induced by the high frequency current $I_R$, both of them flow in opposite directions as shown in FIG. 4.

Figure 7:
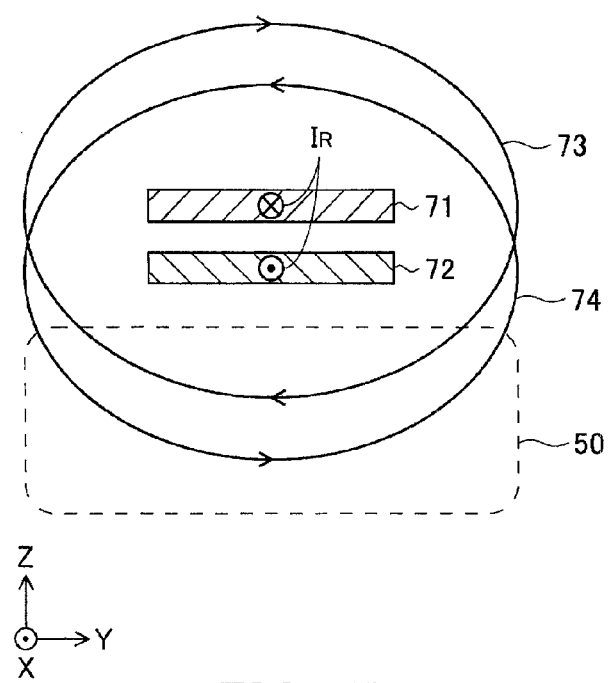
FIG. 7 is a cross-sectional view of go-and-return conductors disposed in the up-down direction.

In order to decrease the potential difference generated between the two ends of the antenna in the longitudinal direction X and to decrease the effective inductance of the antenna by the go-and-return conductors, as shown in FIG. 7, two plate-shaped conductors (go-and-return conductors) 71, 72 can be closely disposed in the up-down direction with respect to the generating region of plasma 50. However, since the magnetic fields 73, 74, formed by the high frequency current $I_R$ which flows in opposite directions in the two conductors 71, 72, flow in opposite directions in the generating region of plasma 50, the magnetic field intensity becomes the difference between the intensities of the two magnetic fields 73, 74 and thus is decreased. Therefore, both the plasma generating efficiency and the high frequency power utilization efficiency can be increased.

Figure 2:
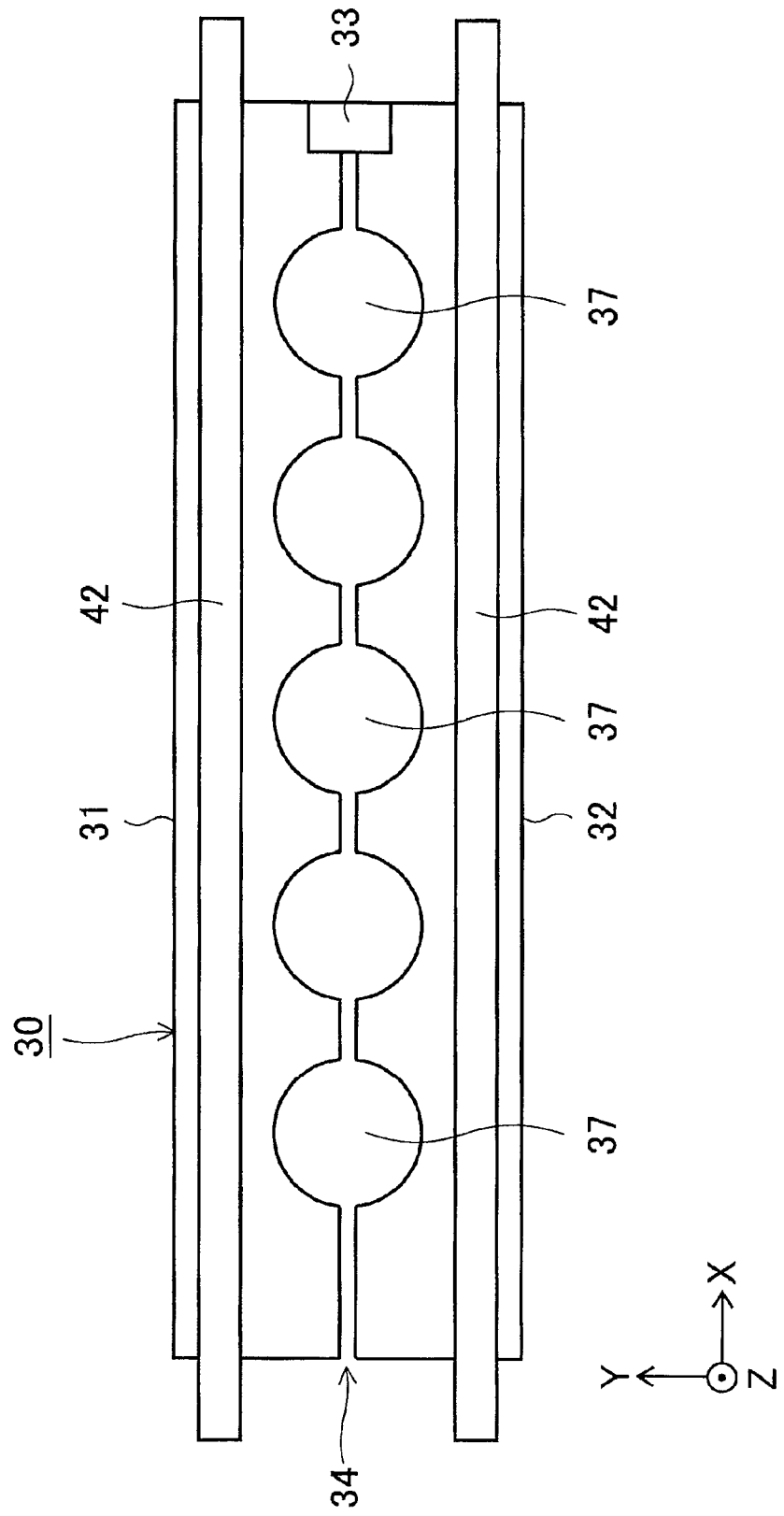
FIG. 2 is a plan view of the antenna of FIG. 1.

As for the cooling of the antenna 30, as shown in FIG. 1 and FIG. 2, a straight cooling pipe 42 can be mounted on each of the two rectangular conductor plates 31, 32. As such, the cooling structure is simple and easy for manufacturing. It is the same in the case of antenna 30 described in the following.

Figure 8:
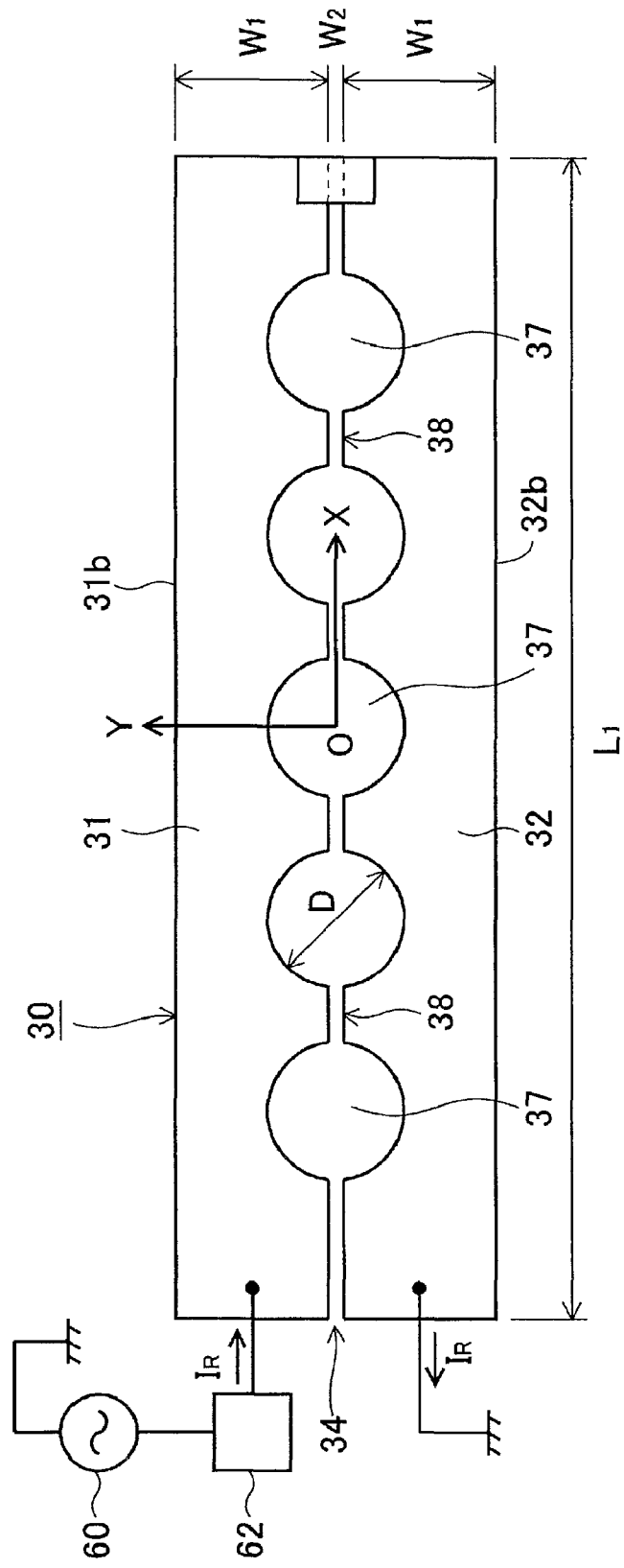
FIG. 8 is a schematic view of the antenna of FIG. 3 with dimensions represented.

FIG. 8 is a schematic view of the antenna of FIG. 3 with dimensions represented. In FIG. 8, the center of each of the openings 37 located at the midpoint of the longitudinal direction X is defined as the origin O of the X, Y directions. Then, the measurement results of the magnetic flux density distribution along the X direction of the antenna of FIG. 8 are illustrated in FIG. 9, and the measurement results of the magnetic flux density distribution along the Y direction of the antenna of FIG. 8 are illustrated in FIG. 10.

The measurement conditions are as follows. Namely, the length $L_1$ of the two rectangular conductor plates 31, 32 is 30 mm, the width $W_1$ is 50 mm, the width $W_2$ of the interval 34 is 5 mm, the quantity of the openings 37 is 5, the diameter D of each of the openings 37 is 40 mm, the distance between every two adjacent openings 37 is 50 mm. The material of the two rectangular conductor plates 31, 32 is copper, the frequency of the high frequency power is 13.56 MHz, the output of the high frequency power source 60 is 3 W. The reflected power is 0 W. The magnetic flux density is measured in the range from the conductor surface to the position of 30 mm. The plasma 50 is not generated.

Figure 9:
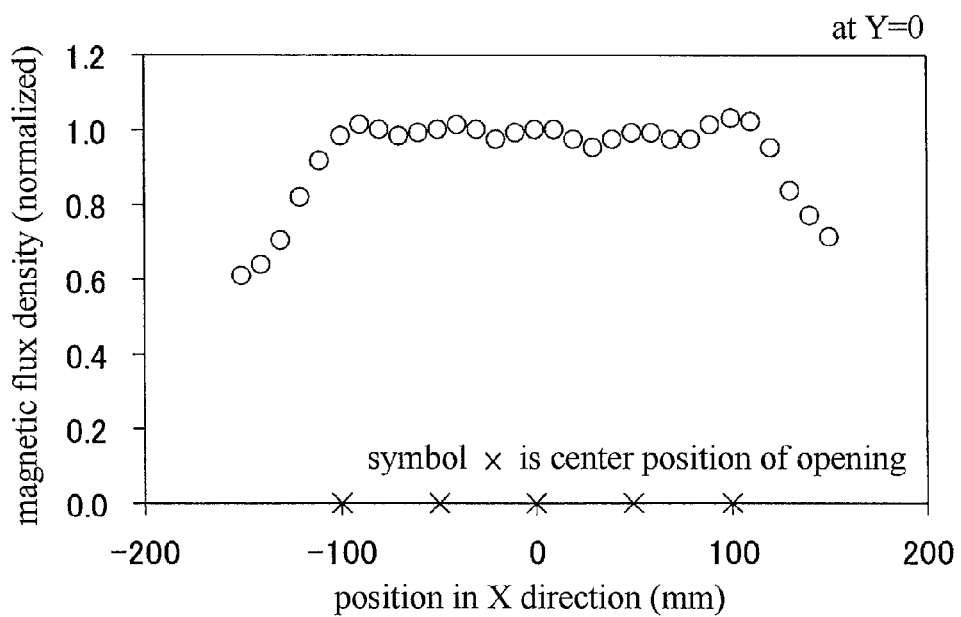
FIG. 9 is a graph illustrating the measurement results of the magnetic flux density distribution along the X direction of the antenna of FIG. 8.

As shown in FIG. 9, pulsation at the openings 37 is less and a uniform and good magnetic flux density distribution is obtained along the longitudinal direction X of the antenna 30. The reasons can be (a) in the position from the conductor surface to 30 mm distance, the magnetic flux density generated around the openings 37 keeps spreading in the X direction, (b) since the width $W_2$ of the interval 34 is 5 mm, the magnetic field occurs even at the connecting portion 38 between the openings 37.

Figure 10:
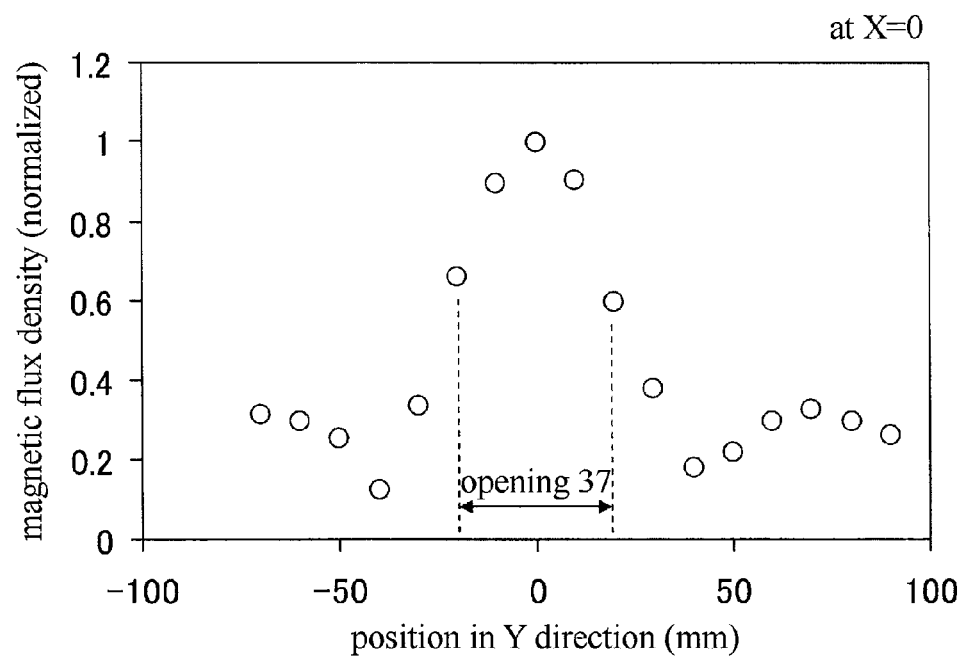
FIG. 10 is a graph illustrating the measurement results of the magnetic flux density distribution along the Y direction of the antenna of FIG. 8.

As shown in FIG. 10, the magnetic field occurring around the center of the openings 37 is strong, whereas the magnetic field occurring around the outer edges 31b, 32b (±50 mm) of the two rectangular conductor plates 31, 32 is weak. As previously described, it represents that the high frequency current flowing through the outer edges 31b, 32b is small.

Instead of designing to be the same, the sizes of the openings 37 and the distances between the openings 37 can also be designed to be different along the longitudinal direction X of the antenna 30. Or, both of designing to be the same and designing to be different may be used. If necessary, the openings 37 located around the center portion of the longitudinal direction X can also be omitted. Accordingly, the plasma density distribution in the longitudinal direction X of the antenna 30 can be adjusted. It is the same in the case of antenna 30 described in the following.

Figure 14:
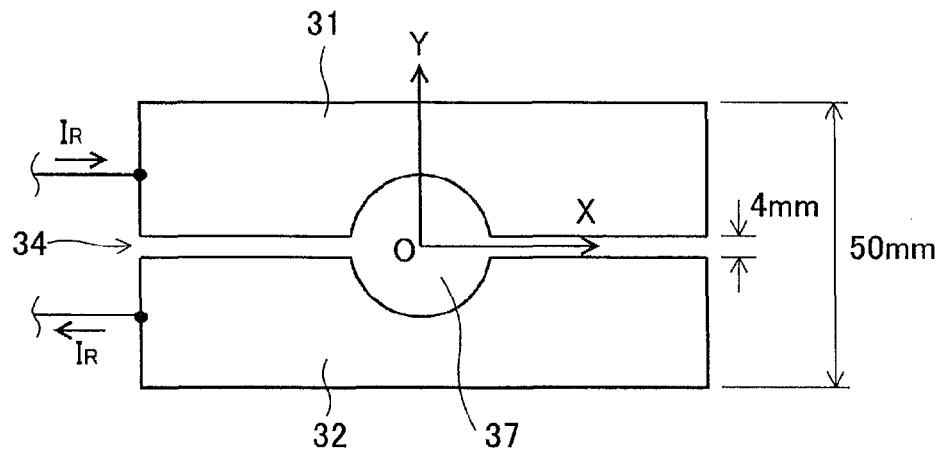
FIG. 14 is a schematic view of the opening of an antenna, wherein the diameter of the opening is changed and the magnetic flux density distributed along the vertical direction of the conductor surface around the opening is measured.
Figure 15:
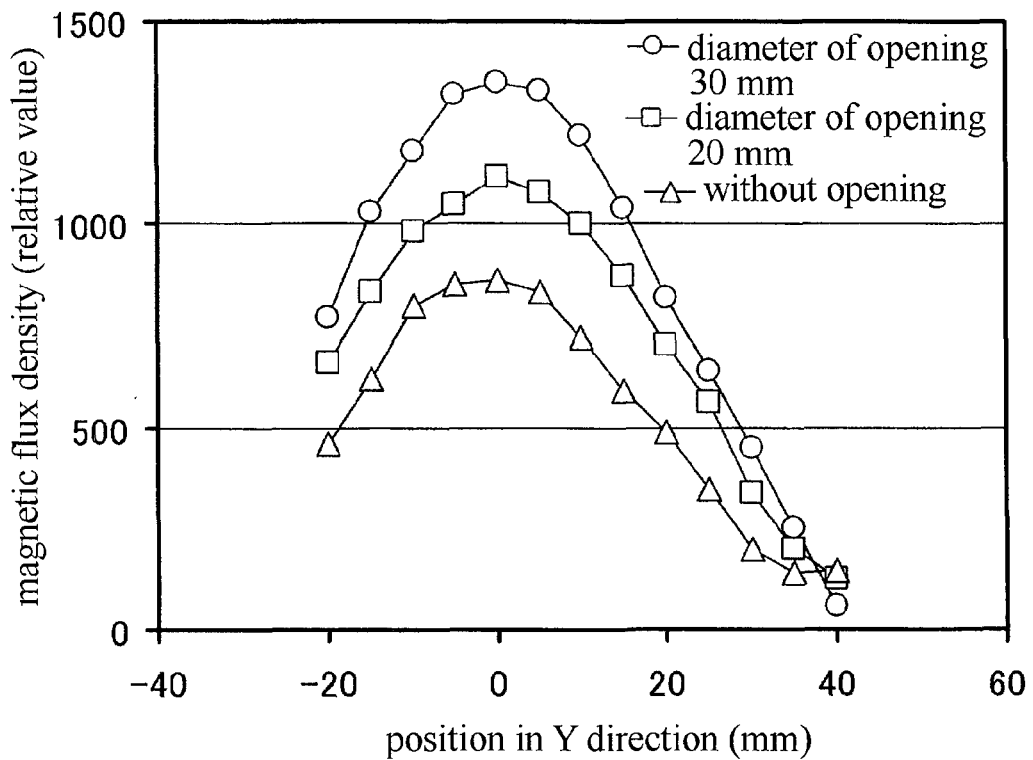
FIG. 15 is a graph illustrating the measurement results of the magnetic flux density distributed along the vertical direction of the conductor surface around the opening of the antenna of FIG. 14.

By using the model shown in FIG. 14, the size (the diameter) of the opening 37 is changed and the magnetic flux density distributed along the vertical direction (Z direction) of the conductor surface around the opening 37 is measured and the measurement results are shown in FIG. 15. The measurement conditions are as follows. The dimensions of the two rectangular conductor plates 31, 32 and the interval 34 are as described in FIG. 14, the material of the two rectangular conductor plates 31, 32 is copper, the frequency of the high frequency power is 13.56 MHz and the high frequency power output during the measurement is 3 W. The magnetic flux density in the range from the conductor surface to 30 mm distance is measured. The plasma is not generated.

As shown in FIG. 15, the magnetic flux density around the opening 37 is increased since the dimension of the opening 37 is increased.

In the case of instead of designing to be the same and the sizes of the openings 37 and the distances between the openings 37 being designed to be different along the longitudinal direction X of the antenna 30, it is specifically described as followed.

In general, the plasma density distribution in the longitudinal direction X of the antenna 30 has the tendency to be smaller at the two terminals than other places. If simply described the reason, the plasma can be diffused from two sides at the central portion whereas the plasma just can be diffused from single side at each of the two terminals.

As such, the openings 37 located at the two ends of the antenna 30 in the longitudinal direction X can be designed to be larger than the rest of the openings 37 located at other places. Accordingly, according to the measurement results illustrated in FIG. 15, since the magnetic flux density around the openings 37 located at the two ends is increased and the plasma density is increased, the uniformity of the plasma density distribution along the longitudinal direction X of the antenna 30 can be improved. As a result, the uniformity of the substrate treatment along the longitudinal direction X of the antenna 30 can also be enhanced. For example, in the case of forming a film on the substrate 2 by the plasma 50, the uniformity of the film thickness distribution along the longitudinal direction X of the antenna 30 can be increased.

In that case, if necessary, the omitting of the openings 37 around the center portion of the longitudinal direction X is possible.

In addition, the distance between the openings 37 located at the two ends of the antenna 30 in the longitudinal direction X (the distance between the adjacent openings 37) can be designed to be smaller than the distances between other openings 37. Accordingly, since the magnetic flux density around the openings 37 located at the two ends can be increased and the plasma density can be increased, the uniformity of the plasma density distribution along the longitudinal direction X of the antenna 30 can be improved. As a result, the uniformity of the substrate treatment along the longitudinal direction X of the antenna 30 can also be enhanced. For example, in the case of forming a film on the substrate 2 by the plasma 50, the uniformity of the film thickness distribution along the longitudinal direction X of the antenna 30 can be increased.

Similarly in that case, if necessary, the openings 37 around the center portion in the longitudinal direction X can be omitted.

Moreover, the openings 37 located at the two ends of the antenna 30 in the longitudinal direction X can be designed to be larger than the rest of the openings 37 located at other places, and the distance between the openings 37 located at the two ends of the antenna 30 in the longitudinal direction X can also be designed to be smaller than the distances between other openings 37.

As shown in FIG. 1, between the antenna 30 placed in the vacuum container 4 and the generating region of the plasma 50, the dielectric plate 52 is disposed so as to obstruct the antenna 30 from the plasma 50. The dielectric plate 52 can be closely disposed to the antenna 30. In this way, the advantage of widening the generating space of the plasma 50 can be achieved. More specifically, in the embodiment, the dielectric plates 52 are respectively disposed around the inlet of each of the openings 37 disposed in the antenna 30. The dielectric plates 52 can be directly disposed around the inlet of the openings 37, and the dielectric plates 52 can also be disposed by using the supporting plates 54 as shown in the embodiment. In addition, a common dielectric plate 52 can also be disposed for a plurality of antennas 30. It is the same in the case of antenna 30 described in the following.

The dielectric plate 52 can consist of, for example, silicon plates or ceramics such as quartz, aluminum, silicon carbide or the like.

Due to the configuration of the dielectric plate 52, the surface of the antenna 30 can be prevented from being sputtered by the charged particles (mainly ions) in the plasma 50. Thus, it is possible to prevent the possibility of causing metal contamination to the plasma 50 and the substrate 2 because of the sputtering. Moreover, although electrons which form the plasma 50 are lighter and the mobility thereof is much larger than the ions, the escaping of the electrons impinged to the antenna 30 can be avoided due to the dielectric plate 52. Therefore, the increase of the plasma potential can be suppressed.

Furthermore, as shown in FIG. 1, the antenna 30 located in the vacuum container 4 can be buried in the dielectric material 48. In the case of the cooling pipes 42 being mounted on the antenna 30, the antenna 30 can also be buried in the dielectric material 48. More specifically, the whole antenna 30 disposed in the opening 7 including the space from the bottom of the antenna 30 to the cover plate 44 is buried in the dielectric material 48. It is the same in the case of antenna 30 described in the following.

The dielectric material 48 consists of insulating inorganic materials such as ceramics and insulating resins.

Even the dielectric plate 52 is disposed, not to mention without the disposing of the dielectric plate 52, it is impossible to completely seal the gas 24. Thus, the gas 24 may be diffused to a portion of the antenna 30 located in the vacuum container 4 if the dielectric material 48 is not disposed. Since the diffused gas 24 may be ionized and may generate or may not generate plasma nearby the antenna 30, the instability of the plasma required for substrate treatment is increased.

Accordingly, since as described above, the gas 24 diffusing to vicinity of the antenna 30 can be prevented by burying the antenna 30 in the dielectric material 48, the unnecessary plasma close to the antenna 30 located in the vacuum container 4 is prevented to be generated. Accordingly, inconvenience due to the increase of instability of the plasma 50 required for substrate treatment and decreasing of utilization efficiency of the high frequency power can be prevented.

Then, in the antenna 30 of other embodiments, the difference from the above mentioned is mainly described.

Figure 11:
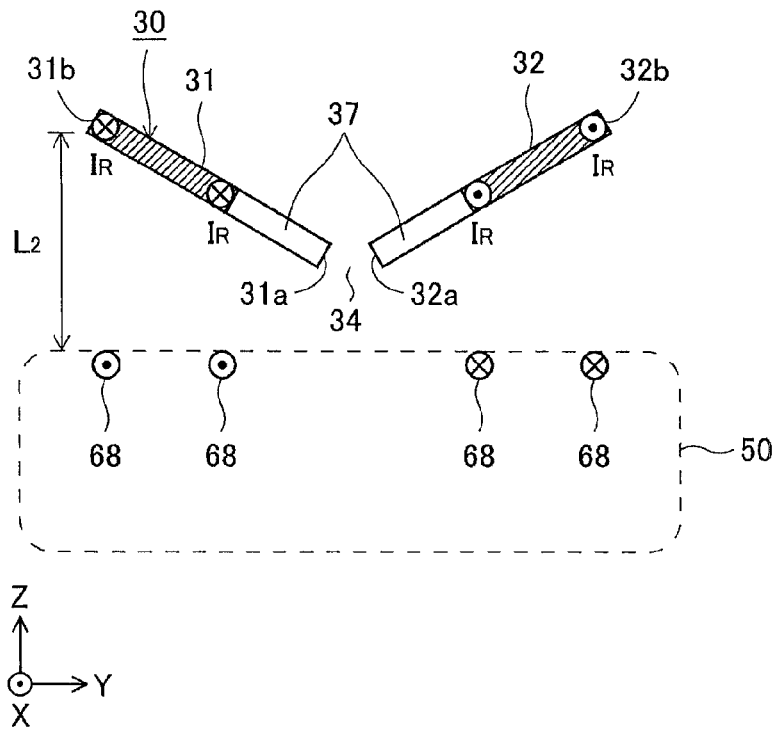
FIG. 11 is a cross-sectional view of an antenna according to another exemplary embodiment of the present invention, wherein the figure corresponds to the cross-sectional view shown in FIG. 4.

Instead of disposing the two rectangular conductor plates 31, 32 of the antenna 30 on the surface of the substrate 2 along the same plane, as shown in FIG. 11, the two rectangular conductor plates 31, 32 are configured in a V-shape cross-sectional structure, wherein the V-shape cross-sectional structure is separated relatively wide at a side facing away from the surface of the substrate 2 (in other words, the opposite side of generating region of the plasma 50) and the two sides 31a, 32a of the two rectangular plates 31, 32 adjacent to the interval 34 can be closely disposed in parallel to each other with the interval 34 therebetween. The disposing of the cooling pipes 42, the dielectric material 48 and the dielectric plate 52 are the same to the embodiment shown in FIG. 1.

As above mentioned, the plasma 50 is generated by the high frequency current $I_R$, and the high frequency current $I_R$ and the induced current which flow in an opposite direction flow through the two rectangular conductor plates 31, 32 in the plasma 50, thus both the inductance and the impedance of the antenna 30 can be decreased, according to the principle which is previously described in accordance with Equation 1 and Equation 2. However, since the two rectangular conductor plates 31, 32 configured in a V-shape cross-sectional structure, the two sides 31a, 32a of the two rectangular plates 31, 32 adjacent to the interval 34 can be closely disposed in parallel to each other with the interval 34 therebetween, and the distance $L_2$ between the sides 31b, 32b facing away from the interval 34 and the surface of the substrate 2 is larger than the distance between the sides 31a, 32a adjacent to the interval 34 and the surface of the substrate 2, the decrease of the inductance is fewer and the impedance is increased. As a result, since more high frequency current $I_R$ can flow along the sides 31a, 32a adjacent to the interval 34 and the openings 37 formed on the sides 31a, 32a adjacent to the interval 34 of the two rectangular conductor plates 31, 32, the high frequency power can be effectively supplied for plasma generating. Accordingly, both the generating efficiency of the plasma 50 and the high frequency power utilization efficiency can be increased.

The degree of inclination of the two rectangular conductor plates 31, 32 can be appropriately prescribed, wherein the larger the degree of inclination is, the effect of the difference of inductance and impendence between the sides 31a, 32a adjacent to the interval 34 and the sides 31b, 32b facing away from the interval 34 may become larger.

Figure 12:
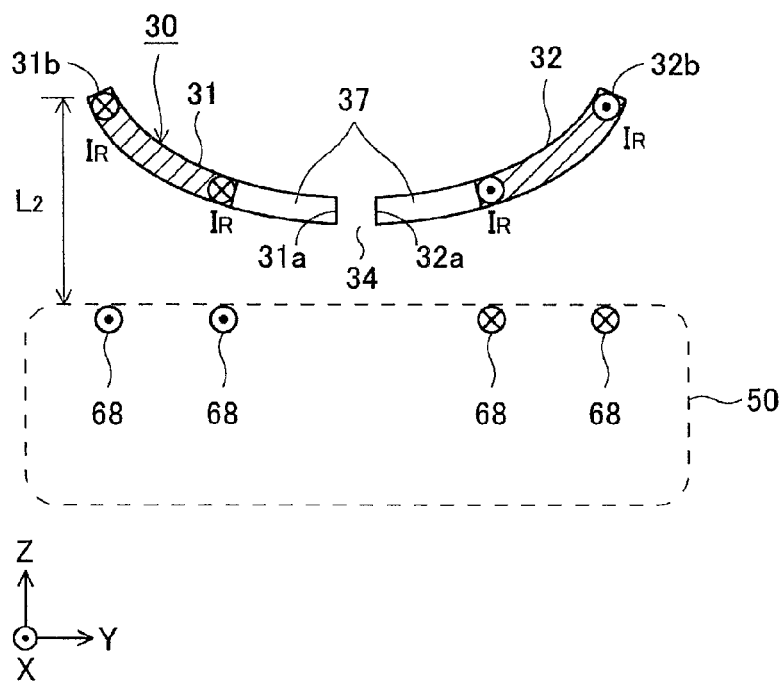
FIG. 12 is a cross-sectional view of an antenna according to another exemplary embodiment of the present invention, wherein the figure corresponds to the cross-sectional view shown in FIG. 4.

Instead of disposing the two rectangular conductor plates 31, 32 of the antenna 30 on the surface of the substrate 2 along the same plane, as shown in FIG. 12, the two rectangular conductor plates 31, 32 are configured in a manner that the two rectangular conductor plates 31, 32 are bent in a short side direction to form a U-shape cross-sectional structure, wherein the U-shape cross-sectional structure is separated relatively wide at a side facing away from the surface of the substrate 2 (in other words, the opposite side of generating region of the plasma 50) and the two sides 31a, 32a of the two rectangular plates 31, 32 adjacent to the interval 34 are closely disposed in parallel to each other with the interval 34 therebetween. It may be planar near the openings 37. The disposing of the cooling pipes 42, the dielectric material 48 and the dielectric plate 52 are the same to the embodiment shown in FIG. 1.

Similarly in this case and because of the same reason described in the embodiment of FIG. 11, since the two rectangular conductor plates 31, 32 are configured in a manner that the two rectangular conductor plates 31, 32 are bent in a short side direction to form a U-shape cross-sectional structure and disposed on the surface of the substrate 2 and the distance $L_2$ between the sides 31b, 32b facing away from the interval 34 and the surface of the substrate 2 is larger than the distance between the sides 31a, 32a adjacent to the interval 34 and the surface of the substrate 2, the decrease of the inductance is fewer and the impedance is increased. As a result, since more high frequency current $I_R$ can flow along the sides 31a, 32a adjacent to the interval 34 and the openings 37 formed on the sides 31a, 32a adjacent to the interval 34 of the two rectangular conductor plates 31, 32, the high frequency power can be effectively supplied for plasma generating. Accordingly, both the generating efficiency of the plasma 50 and the high frequency power utilization efficiency can be increased.

The degree of bending of the two rectangular conductor plates 31, 32 can be appropriately prescribed, wherein the larger the degree of bending is, the effect of the difference of inductance and impendence between the sides 31a, 32a adjacent to the interval 34 and the sides 31b, 32b facing away from the interval 34 may become larger.

Figure 13:
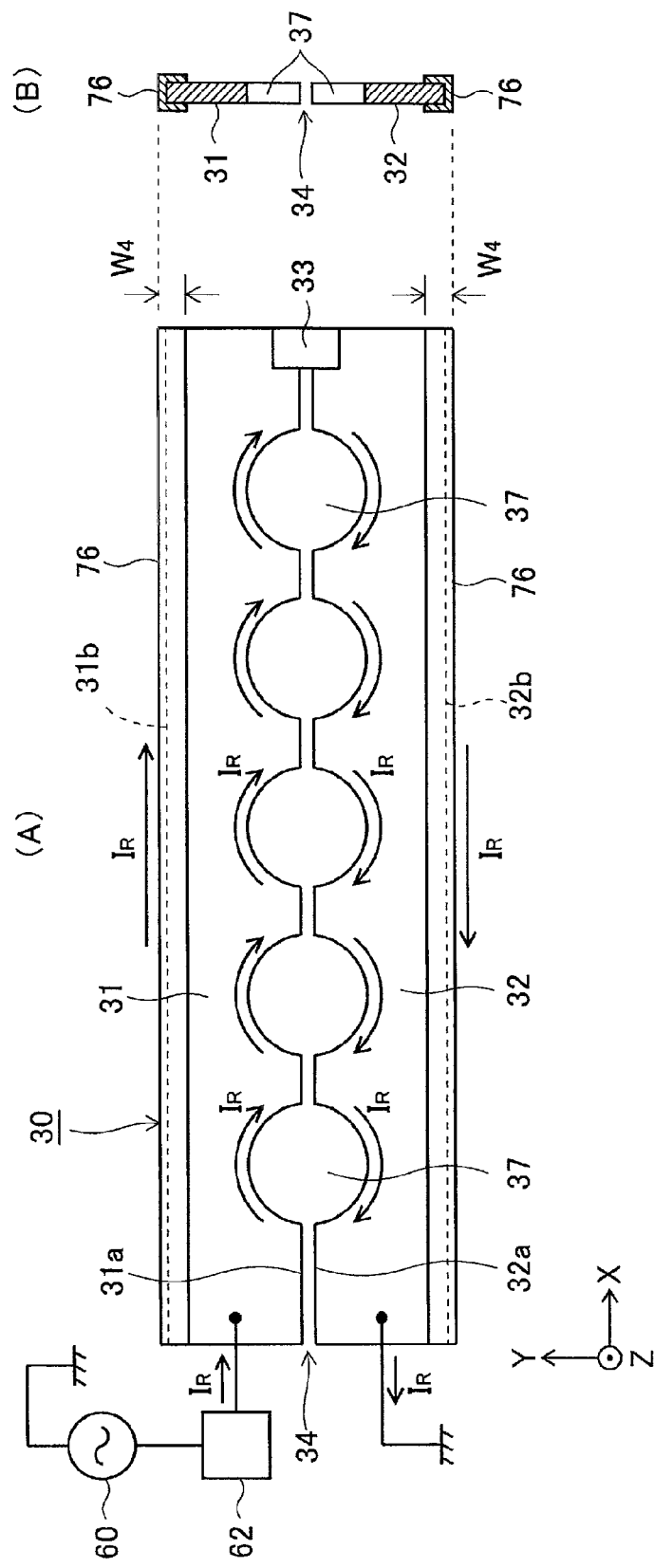
FIG. 13A is a schematic plan view of an antenna according to another exemplary embodiment of the present invention.
FIG. 13B is a schematic cross-sectional view of the antenna of FIG. 13A.

As shown in the embodiment of FIG. 13, peripheries of the sides 31b, 32b facing away from the interval 34 of the two rectangular conductor plates 31, 32 of the antenna 30 is covered by a conductor 76, wherein the specific resistance of the conductor 76 is greater than the specific resistance of the material of the two rectangular conductor plates 31, 32, and the thickness of the conductor 76 is equal to or greater than a skin depth of the high frequency current $I_R$ flowing through the conductor 76.

Thus, by the skin effect, the high frequency current $I_R$ can mainly flow through the ends of each side of the two rectangular conductor plates 31, 32. Therefore, referring to the sides 31b, 32b facing away from the interval 34 of the two rectangular conductor plates 31, 32, the peripheries (the top, bottom and end) of the sides 31b, 32b facing away from the interval 34 are covered by the conductor 76. The width $W_4$ of the conductor 76 in the Y direction is about 10 mm to 20 mm, for example, and it is sufficient. For instance, the conductor 76 for covering as mentioned above can be simply formed by performing with a plating method onto the sides 31b, 32b facing away from the interval 34 of the two rectangular conductor plates 31, 32.

The material of the conductor 76 can be copper, aluminum or the like as above mentioned. Instead, the material of the conductor 76 with a large specific resistance can be, for example, nickel, iron or the like. Those materials not only have large specific resistance but also have large magnetic permeability.

The skin depth of the high frequency current $I_R$ is represented as $\delta$ in the following equation, wherein f is the frequency of the high frequency current $I_R$, $\mu$ is the magnetic permeability of the conductor 76, and $\sigma$ is the conductivity (=1/specific resistance $\rho$) of the conductor 76.

$$\delta = \frac{1}{\sqrt{(\pi f \mu \sigma)}} \quad (3)$$

More specifically, the frequency f is 13.56 MHz. In the case of the conductor 76 being nickel, the magnetic permeability $\mu$ is about 2.4 $\pi \times 10^{-4}$ N/A2, the specific resistance $\rho$ is about 6.84×10$^{-8}$ $\Omega$m, the conductivity $\sigma$ is about 14.5×10$^6$ $\Omega$m, therefore the skin depth $\delta$ is about 1.47 μm. Accordingly, the thickness of the conductor 76 can be more than above value.

Since the conductor 76 is covered and due to the skin effect the high frequency current $I_R$ flowing through the sides 31b, 32b facing away from the interval 34 of the rectangular conductor plates 31, 32 mainly flows through the conductor 76 having a larger specific resistance, the impedance of the sides 31b, 32b facing away from the interval 34 of the two rectangular conductor plates 31, 32 is increased. As a result, since more high frequency current $I_R$ can flow along the sides 31a, 32a adjacent to the interval 34 and the openings 37 formed on the sides 31a, 32a adjacent to the interval 34 of the two rectangular conductor plates 31, 32, the high frequency power can be effectively supplied for plasma generating. Accordingly, both the plasma generating efficiency and the high frequency power utilization efficiency can be increased.

Figure 16:
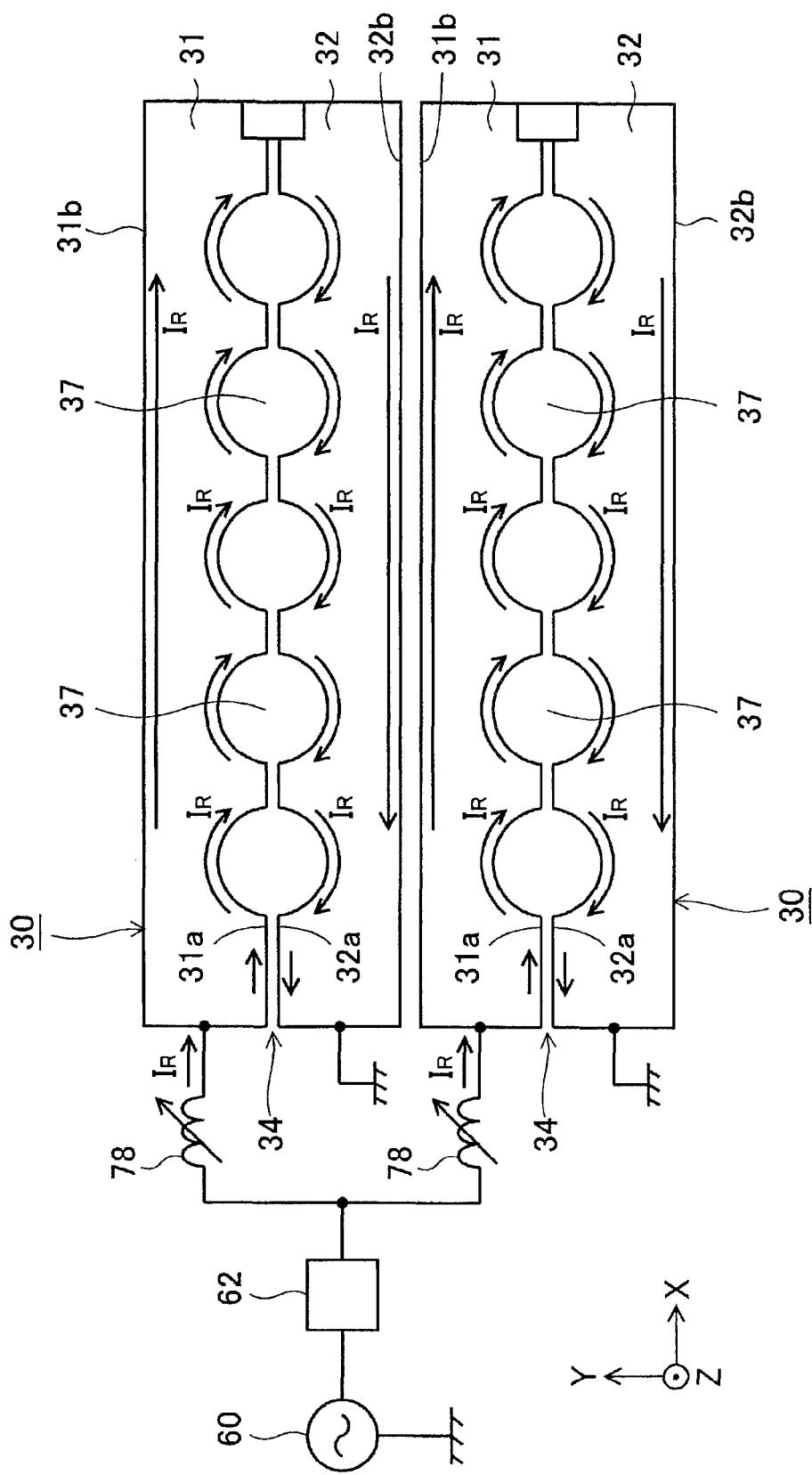
FIG. 16 is a plan view showing that a plurality of antennas are disposed in parallel and high frequency power is parallelly supplied thereto by a common high frequency power source according to an exemplary embodiment of the present invention.
Figure 17:
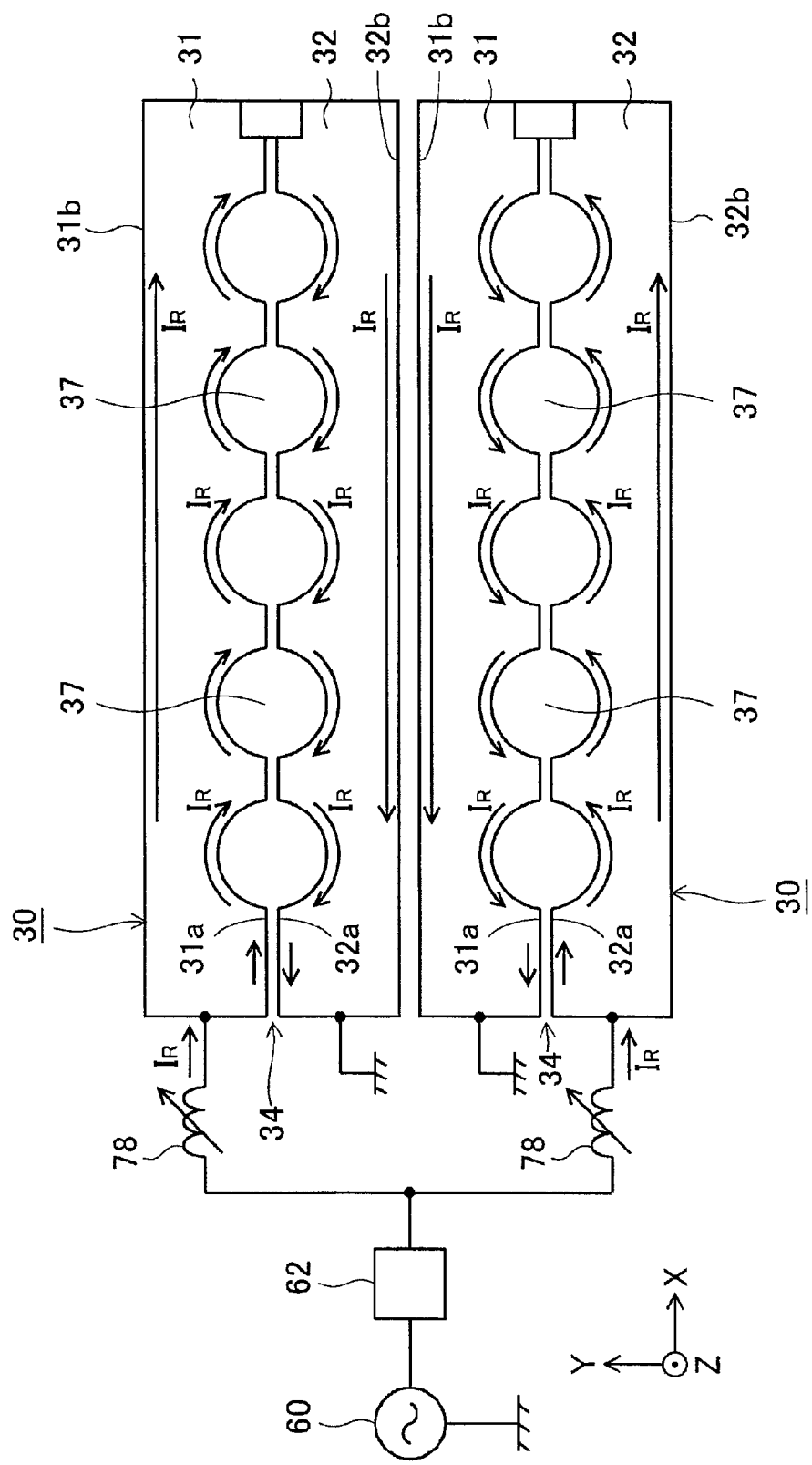
FIG. 17 is a plan view showing that a plurality of antennas are disposed in parallel and high frequency power is parallelly supplied thereto by a common high frequency power source according to another exemplary embodiment of the present invention.

As shown in the embodiments of FIG. 16 and FIG. 17, a plurality of the antennas 30 described above are parallelly disposed in the Y direction. High frequency power from a common high frequency power source 60 can be supplied in parallel to the antennas 30. The structure of each of the antennas 30 is the same as aforementioned.

The high frequency power source 60 (more specifically the matching circuit 62 connected thereto) and each of the antennas 30 can be connected via the variable impedance 78 as shown in the figures, and they can also be directly connected to each other.

The variable impedance 78 can be the variable inductance shown in the figure, can also be a variable condenser (a variable capacitance), or a combination thereof. Since the impedance of the feeding circuit can be increased by inserting the variable inductance, it is possible to suppress the current of the antenna 30 where the high frequency current $I_R$ is excessively flowed. Since if the inductive reactance is greater the capacitive reactance is increased and the impedance of the feeding circuit can be decreased by inserting the variable condenser, it is possible to increase the current of the antenna 30 where the high frequency current $I_R$ is hard to flow.

Referring to FIG. 16 and FIG. 17, in the example of FIG. 16, high frequency power from a common high frequency power source 60 is supplied in parallel to each of the antennas 30 in a manner that the high frequency current $I_R$ flowing through the adjacent antennas 30 at the adjacent rectangular conductor plates 31, 32 at the two sides 32b, 31b facing away from the interval 34 can be in opposite directions, whereas in the example of FIG. 17, high frequency power from a common high frequency power source 60 is supplied in parallel to each of the antennas 30 in a manner that the high frequency current $I_R$ flowing through the adjacent antennas 30 at the adjacent rectangular conductor plates 31, 32 at the two sides 32b, 31b facing away from the interval 34 can be in the same direction.

The quantity of the antennas 30 is not limited to be two as shown in the examples, and the antennas 30 can be more than two.

Even in one of the case shown in FIG. 16 and FIG. 17, since a plurality of antennas 30 are disposed in parallel to each other and the high frequency power is supplied thereto in parallel, it is possible to generate a large area of plasma.

However, from the viewpoint of generating the magnetic field in the vicinity of the openings 37, the example shown in FIG. 17 is preferable. This is due to the following reasons.

Namely, in the case of example shown in FIG. 16, since the high frequency currents $I_R$ flowing between the adjacent antennas 30 at the adjacent rectangular conductor plates 31, 32 at the two sides 32b, 31b facing away from the interval 34 are in opposite directions, according to the principle previously described in Equation 1 and Equation 2, due to the mutual inductance between the sides 32b, 31b facing away from the interval 34, the inductance thereof is decreased. As a result, since the high frequency current $I_R$ flowing through the adjacent antennas 30 at the adjacent rectangular conductor plates 31, 32 at the two sides 32b, 31b facing away from the interval 34 is increased and the high frequency current $I_R$ flowing through the sides 32a, 31a adjacent to the interval 34 and the openings 37 is decreased, the magnetic field generated around the openings 37 is decreased. In this issue, though it can be alleviated by increasing the distance between two adjacent antennas 30, doing so can result in the decrease of the plasma density distributed in the increased interval. Thus, another issue results in the decrease of the uniformity of the entire plasma generated by the plurality of antennas 30.

On the contrary, in the case of example shown in FIG. 17, since the high frequency currents $I_R$ flowing through the adjacent antennas 30 at the adjacent rectangular conductor plates 31, 32 at the two sides 32b, 31b facing away from the interval 34 are in the same direction, according to the principle previously described in Equation 1 and Equation 2 (however, in this case, it becomes +M), due to the mutual inductance between the sides 32b, 31b facing away from the interval 34, the inductance thereof is increased. As a result, since the high frequency current $I_R$ flowing through the adjacent antennas 30 at the adjacent rectangular conductor plates 31, 32 at the two sides 32b, 31b facing away from the interval 34 is decreased and the high frequency current $I_R$ flowing through the sides 32a, 31a adjacent to the interval 34 and the openings 37 can be increased, it is possible to increase the magnetic field generated around the openings 37. Accordingly, since the high frequency power can be effectively supplied for plasma generating, it is possible to increase both the plasma generating efficiency and the high frequency power utilization efficiency.

What is claimed is:

1. A plasma processing apparatus, which is an inductively-coupled-plasma processing apparatus, comprising:
an antenna, substantially straight in a plan view of the antenna, wherein a plasma is generated for performing a plasma treatment to a substrate by applying a high frequency current to the antenna to induce an electric field in a vacuum container, and the antenna comprises:
two rectangular conductor plates, disposed on a same plane along a surface of the substrate in a manner that the two rectangular conductor plates are parallel to each other with an interval therebetween, and an end of a side in a longitudinal direction of each of the two rectangular conductor plates is connected through a conductor so as to form a go-and-return conductor, wherein the high frequency current flows in the two rectangular conductor plates in opposite directions,
wherein a plurality of notches is formed at the sides of the two rectangular conductor plates adjacent to the interval, the notches of the plurality of notches facing each other define an opening, and the plurality of notches forms a plurality of openings, and the plurality of openings is separately arranged in the longitudinal direction of the antenna.

2. The plasma processing apparatus as claimed in claim 1, wherein the openings of the plurality of openings located at two ends of the antenna in the longitudinal direction are larger than a rest of the plurality of openings.

3. The plasma processing apparatus as claimed in claim 1, wherein a distance between each of the plurality of openings located at two ends of the antenna in the longitudinal direction is smaller than a distance between a rest of two openings of the plurality of openings.

4. The plasma processing apparatus as claimed in claim 1, wherein a periphery of a side facing away from the interval of each of the two rectangular conductor plates is covered by a conductor, a specific resistance of the conductor is greater than a specific resistance of a material of the two rectangular conductor plates, and a thickness of the conductor is equal to or greater than a skin depth of the high frequency current flowing through the conductor.

5. The plasma processing apparatus as claimed in claim 1, further comprising a dielectric plate and a dielectric material, wherein the dielectric plate is disposed between the antenna located in the vacuum container and a generating region of the plasma so as to obstruct the antenna from the plasma, and the antenna is buried in the dielectric material.

6. The plasma processing apparatus as claimed in claim 1, comprising a plurality of the antennas, which are disposed in parallel to each other, wherein a high frequency power is parallelly supplied to each of the plurality of the antennas by using a common high frequency power source in a manner that the high frequency current flowing through the adjacent antennas of the plurality of the antennas at the adjacent rectangular conductor plates at two sides facing away from the interval are in a same direction.

7. A plasma processing apparatus, which is an inductively-coupled-plasma processing apparatus, comprising: an antenna, wherein a plasma is generated for performing a plasma treatment to a substrate by applying a high frequency current to the antenna to induce an electric field in a vacuum container, and the antenna comprises: two rectangular conductor plates, wherein the two rectangular conductor plates are configured in a V-shape cross-sectional structure, wherein the V-shape cross-sectional structure is separated wide at a side facing away from the surface of the substrate and the two sides of the two rectangular plates adjacent to the interval are narrowly disposed in parallel to each other with the interval therebetween, and an end of a side in a longitudinal direction of each of the two rectangular conductor plates is connected through a conductor so as to form a go-and-return conductor, wherein the high frequency current flows in the two rectangular conductor plates in opposite directions, wherein a plurality of notches is formed at the sides of the two rectangular conductor plates adjacent to the interval, the notches of the plurality of notches facing each other define an opening, and the plurality of notches forms a plurality of openings, and the plurality of openings is separately arranged in the longitudinal direction of the antenna.

8. A plasma processing apparatus, which is an inductively-coupled-plasma processing apparatus, comprising: an antenna, wherein a plasma is generated for performing a plasma treatment to a substrate by applying a high frequency current to the antenna to induce an electric field in a vacuum container, and the antenna comprises: two rectangular conductor plates, wherein the two rectangular conductor plates are configured in a manner that the two rectangular conductor plates are bent in a short side direction to form a U-shape cross-sectional structure, wherein the U-shape cross-sectional structure is separated wide at a side facing away from the surface of the substrate and the two sides of the two rectangular plates adjacent to the interval are narrowly disposed in parallel to each other with the interval therebetween, and an end of a side in a longitudinal direction of each of the two rectangular conductor plates is connected through a conductor so as to form a go-and-return conductor, wherein the high frequency current flows in the two rectangular conductor plates in opposite directions, wherein a plurality of notches is formed at the sides of the two rectangular conductor plates adjacent to the interval, the notches of the plurality of notches facing each other define an opening, and the plurality of notches forms a plurality of openings, and the plurality of openings is separately arranged in the longitudinal direction of the antenna.

* * * * *